29-838 SR

XR 3,508,315

CROSS REFERENCE SEARCH ROOM

BEST AVAILABLE COPY

April 28, 1970 3,508,315

APPARATUS FOR INSERTING AND FOR SECURING PREFORMED ELECTRONIC COMPONENTS TO PRINTED CIRCUIT BOARDS

Filed July 26, 1967 7 Sheets-Sheet 1

INVENTOR
FRED H. HOFFKEN
Louis Necho
ATT'Y.

3508315
SR IN 227/99

BEST AVAILABLE COPY

April 28, 1970 F. H. HOFFKEN 3,508,315

APPARATUS FOR INSERTING AND FOR SECURING PREFORMED ELECTRONIC COMPONENTS TO PRINTED CIRCUIT BOARDS

Filed July 26, 1967 7 Sheets-Sheet 2

INVENTOR
FRED H. HOFFKEN

Louis Necho
ATT'Y.

BEST AVAILABLE COPY

April 28, 1970 F. H. HOFFKEN 3,508,315

APPARATUS FOR INSERTING AND FOR SECURING PREFORMED ELECTRONIC COMPONENTS TO PRINTED CIRCUIT BOARDS

Filed July 26, 1967 7 Sheets-Sheet 3

INVENTOR
FRED H. HOFFKEN

Louis Necho
ATT'Y.

BEST AVAILABLE COPY

April 28, 1970 F. H. HOFFKEN 3,508,315

APPARATUS FOR INSERTING AND FOR SECURING PREFORMED ELECTRONIC COMPONENTS TO PRINTED CIRCUIT BOARDS

Filed July 26, 1967 7 Sheets-Sheet 4

INVENTOR
FRED H. HOFFKEN

Louis Necho
ATT'Y.

BEST AVAILABLE COPY

April 28, 1970 F. H. HOFFKEN 3,508,315

APPARATUS FOR INSERTING AND FOR SECURING PREFORMED ELECTRONIC COMPONENTS TO PRINTED CIRCUIT BOARDS

Filed July 26, 1967 7 Sheets-Sheet 5

INVENTOR
FRED H. HOFFKEN

Louis Necho
ATT'Y.

BEST AVAILABLE COPY

April 28, 1970 F. H. HOFFKEN 3,508,315

APPARATUS FOR INSERTING AND FOR SECURING PREFORMED ELECTRONIC COMPONENTS TO PRINTED CIRCUIT BOARDS

Filed July 26, 1967 7 Sheets-Sheet 6

INVENTOR
FRED H. HOFFKEN

Louis Necho
ATT'Y.

BEST AVAILABLE COPY

INVENTOR
FRED H. HOFFKEN
Louis Necho
ATT'Y.

BEST AVAILABLE COPY

United States Patent Office 3,508,315
Patented Apr. 28, 1970

3,508,315

APPARATUS FOR INSERTING AND FOR SECURING PREFORMED ELECTRONIC COMPONENTS TO PRINTED CIRCUIT BOARDS

Fred H. Hoffken, Springfield, Pa.
(% Essington Metal Works Inc., Essington, Pa. 10929)

Filed July 26, 1967, Ser. No. 656,113
Int. Cl. H05k 3/30
U.S. Cl. 29—203 7 Claims

ABSTRACT OF THE DISCLOSURE

Apparatus for withdrawing circuit completing components from dispensing magazines and for inserting them through, and for securing them to a printed circuit board selectively to connect circuit components to complete the desired circuits.

THE INVENTION

Apparatus including a hopper containing a stack of printed circuit plates, each of which is provided with one or more pairs of perforations oriented to receive the end wires of electronic components; correspondingly oriented magazines containing preformed uniform components, the end wires of which are to pass through the perforations in said circuit boards or plates electrically to connect the otherwise unconnected parts of circuits printed or otherwise applied to said boards; means for simultaneously and automatically withdrawing components, one from each hopper; means for withdrawing a printed circuit board from said bin; means for simultaneously and automatically inserting said connectors through the holes in a plate; means for automatically and simultaneously disposing of boards which have received their complement of components, and means for detecting the absence, or the mis-connection, of a component, and for correcting the defect.

CROSS REFERENCE

Patents No. 2,893,006 and No. 3,200,481.

IN THE DRAWINGS

Figure 1:
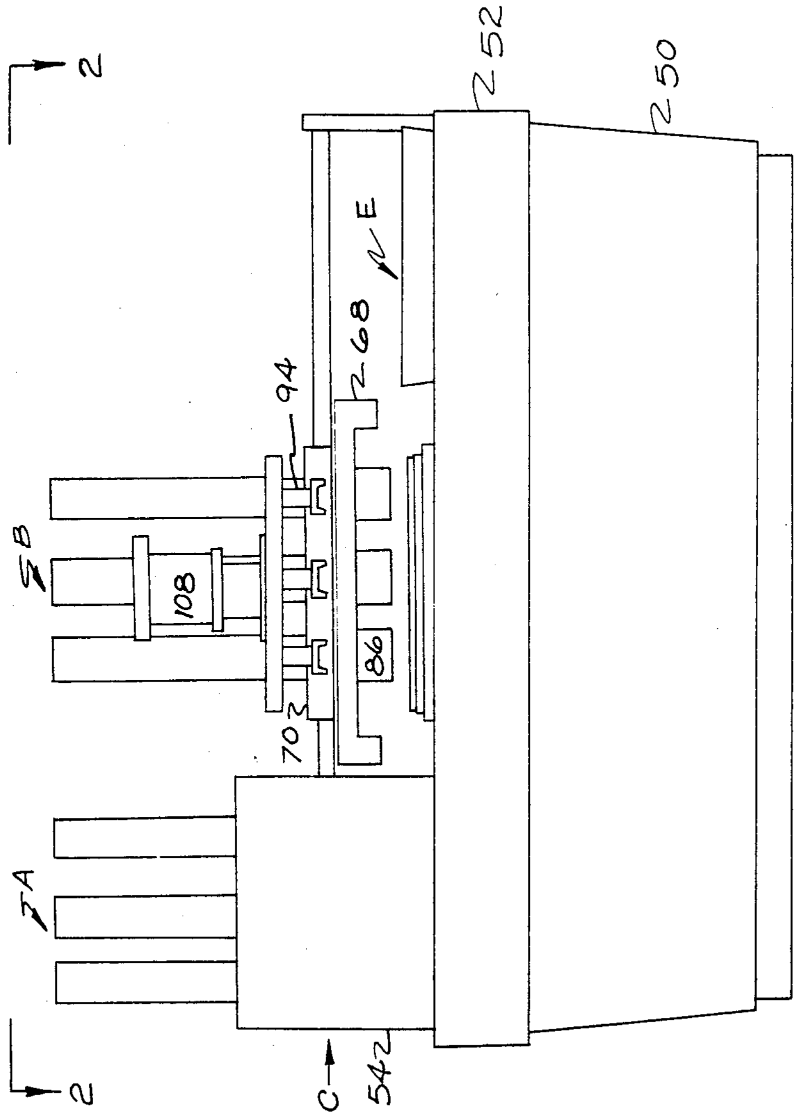
FIG. 1 is a front elevational view of an apparatus embodying the invention.

The machine of this invention is mounted on a frame 52 which is mounted on any suitable bed, or support 50, FIG. 1.

Figure 2:
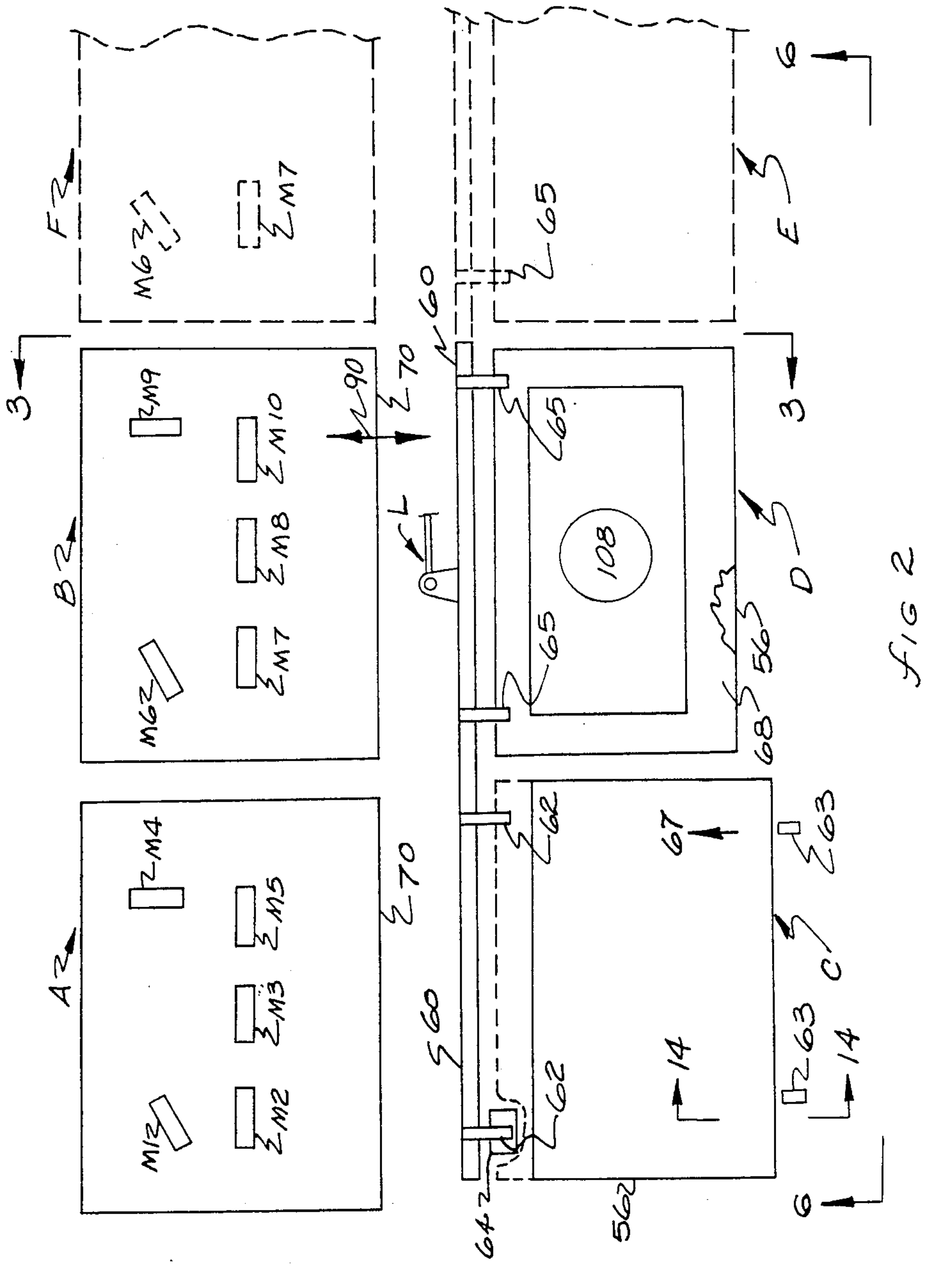
FIG. 2 is a top plan view looking in the direction of line 2—2 on FIG. 1.
Figure 10:
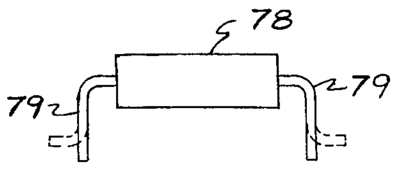
FIG. 10 is an elevational view of an electrical component to be secured to the blank side of a printed circuit board, one side of which is shown in FIG. 11.

As will be seen from FIG. 2, the machine has stations A, B, C, D, E, and F. At Station A, there is a horizontally reciprocable platform or base which supports magazines M–1 through M–5, and at Station B, there is a similar platform which supports magazines M–6 through M–10. Each magazine contains a stack of electrical components, such as that shown in FIG. 10 and which are later on described. It will be noted that the magazines are randomly oriented so that magazines M–1 and M–4 are at an angle to magazines M–2, M–3 and M–5, and so on. Stations A, F and C may be called "storage" stations, in that magazines M–1 to M–5 are restocked at Station A; in that magazines M–6 to M–10 are restocked at Station F; and in that the supply of circuit boards is at Station C. Stations B and D may be called the "operating" stations in that the components to be secured to the boards are withdrawn from the magazines at Station B and are secured to the boards at Station D. Station E is where the boards which have received their complement of components are deposited for removal.

Figure 6:
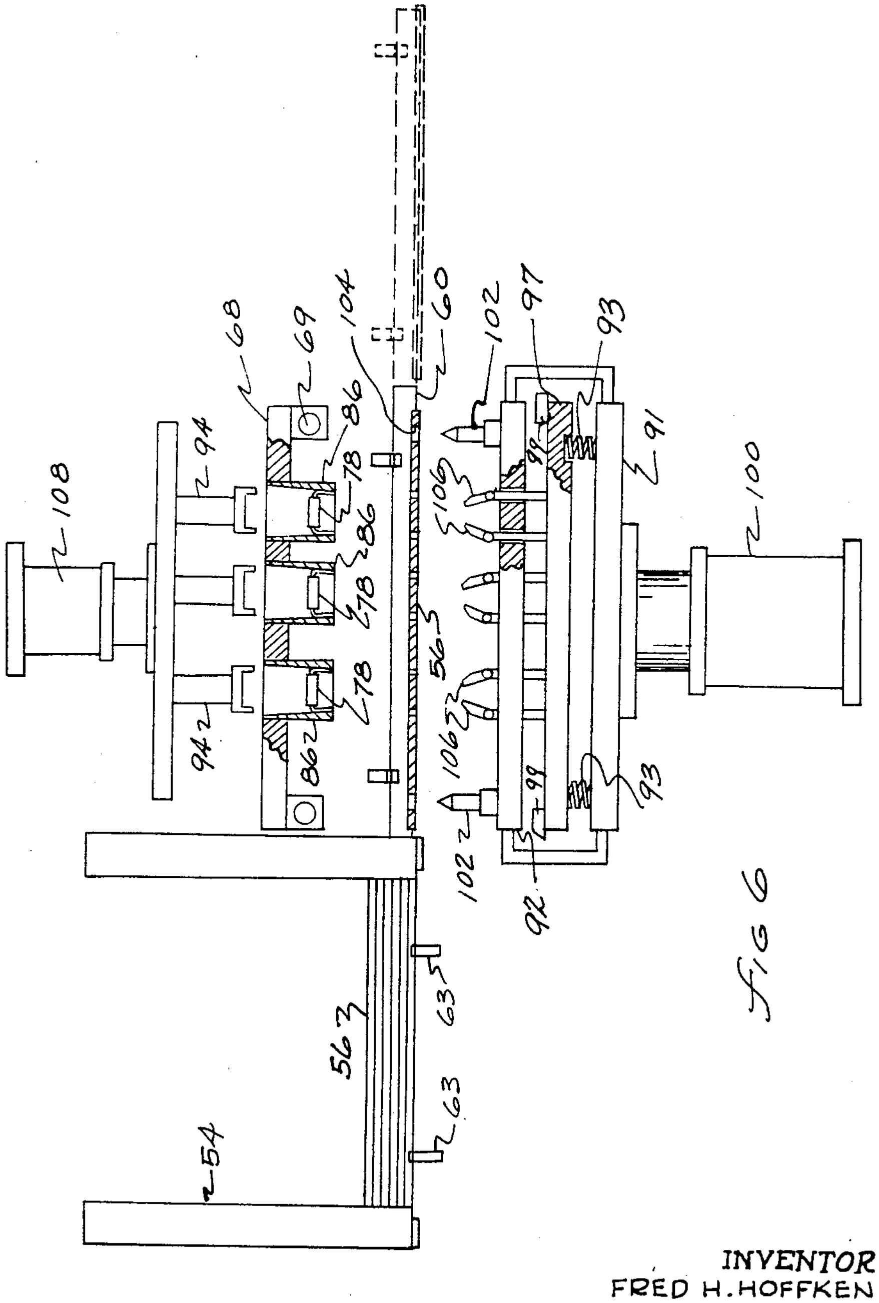
Figure 11:
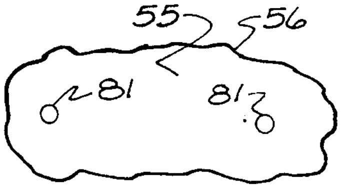
FIG. 11 shows the blank side of a printed circuit board.
Figure 12:
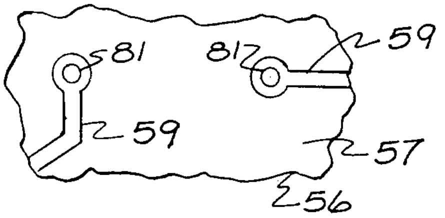
FIG. 12 shows the other side of the board which has electric circuit terminals which are to be inter-connected by a component.
Figure 13:
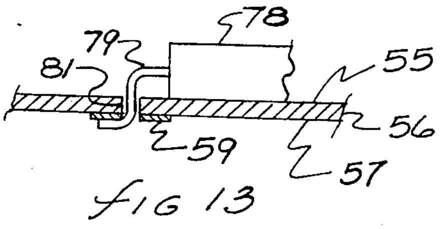
FIG. 13 is a longitudinal vertical sectional view showing the component of FIG. 10 secured, in circuit completing position, to the board of FIGS. 11 and 12.

At Station C, FIGS. 2 and 6, I provide a hopper 54 which contains a stack of printed circuit boards 56 to which the electronic components are to be secured. Each board has a blank side 55 which is shown in FIG. 11 and a side 57 on which disconnected circuit parts 59 are printed as shown diagrammatically in FIG. 12. These boards are of any desired size and are perforated according to any desired pattern, to form holes 81 for receiving the end wires 79 of correspondingly oriented components 78, FIG. 13. As illustrated, each of boards 56 has five pairs of holes 81, only two of which are shown in FIG. 11. It will be understood that this is only an example; that the boards can have a lesser or a much greater number of paired holes, and that the number of magazines, and their angular disposition, will necessarily correspond to the number and angular disposition of the components 78 which are to be secured to the boards.

Each set of magazines M–1 to M–5, and M–6 to M–10, is carried by a movable base 70 which has openings 72 therethrough, which align with the lower ends of the magazines. Openings 72 may be slightly narrower than the openings in the magazines, or the magazines may have some yielding obstructions 76 which prevent components 78 from freely falling through openings 72 but which permit components 78 to be pushed, or pulled, down through these openings, FIG. 3.

Figure 3:
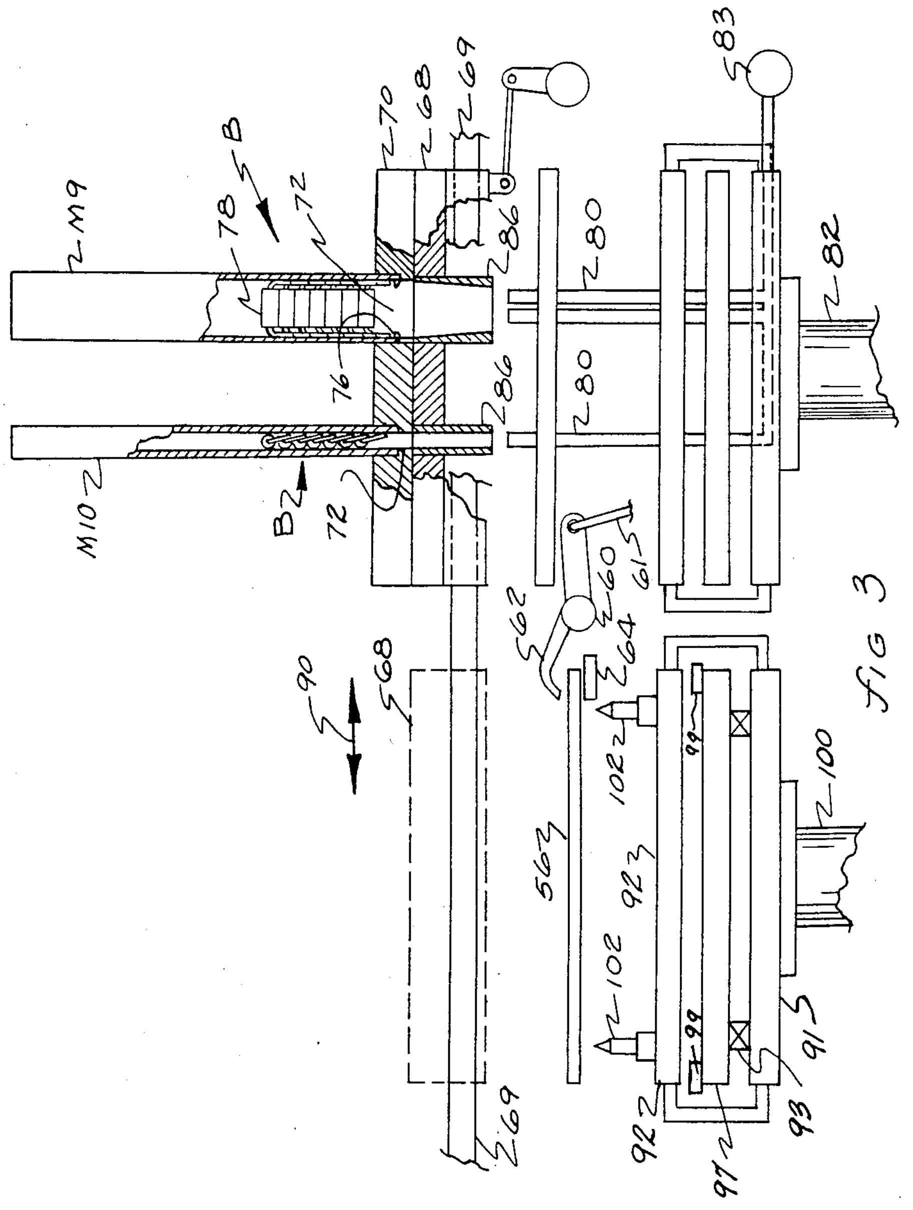
FIG. 3 is a sectional view looking in the direction of line 3—3 on FIG. 2, certain parts being omitted.
Figure 4:
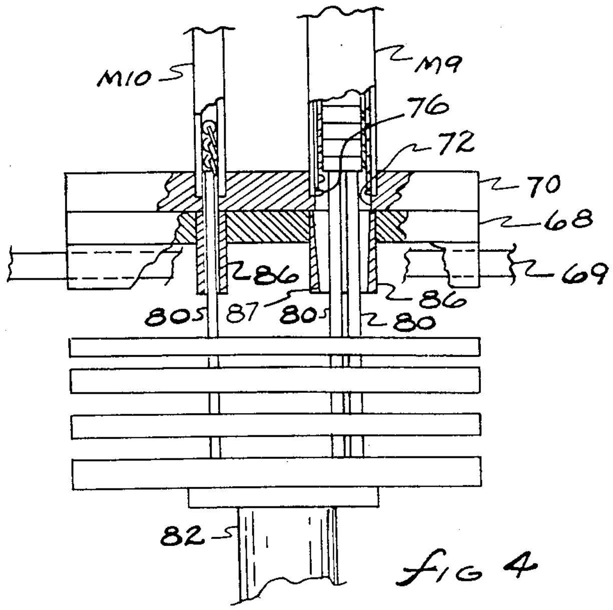
FIGS. 4 through 9 are enlarged, fragmentary views, partly in section and partly in elevation, showing details of construction and the steps followed in carrying out the invention.

Below the magazines at Station B is provided a device for pulling components 78 down, one at a time, from each magazine which happens to be at Station B. As illustrated, this device consists of one, or two, suction tubes 80 which are connected to a source of suction 83 and which are vertically reciprocated by cylinder 82 or its equivalent. Tubes 80 are adapted to move up into the magazines at Station B and, by applying suction, to pull down one component from each magazine. In FIG. 3, the tubes are about to enter, and, in FIG. 4, they have entered the magazines and have engaged the lowermost component therein.

The machine further includes a carriage 68 which is movable over tracks 69 in the direction of the double-headed arrows 90 shown in FIGS. 2 and 3. This means that carriage 68 can be moved to the position shown in solid lines in FIG. 2 and in broken lines in FIG. 3, or to the solid line position shown in FIG. 3. It will be noted that, when carriage 68 is in the solid line position of FIG. 3, the openings, or sleeves 86 in the carriage, align with suction tubes 80 and with magazines M–6 to M–10 at Station B, FIG. 4. By this arrangement, tubes 80 can move up through openings 86 and 72 and into the magazines to engage and bring down components 78, FIG. 3. It will be noted that the suction in tubes 80 is sufficient to move a component 78 down past restrictions 76 and to the bottom of openings or sleeves 86. When the components reach the bottom of openings 86, suction in tubes 80 ceases and the tubes are withdrawn. It will be noted that the lower ends of sleeves 86 are constricted as at 87

Figure 5:
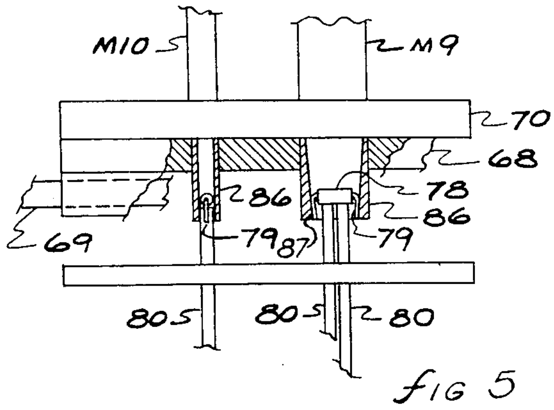

BEST AVAILABLE COPY so as to prevent the components from falling out, (see FIG. 5). This insures the positive withdrawal of components, one at a time, out of the magazines and the positioning of the components at the bottom of openings 86 in carriage 68 where the components are retained by the frictional engagement of end wires 79 with the restrictions 87 at the bottom of sleeve 80.

Figure 14:
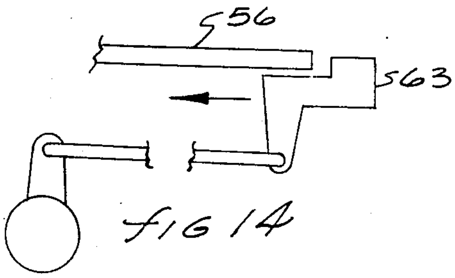
FIG. 14 is a fragmentary sectional view looking in the direction of line 14—14 on FIG. 2.

While carriage 68 is being moved to Station B to receive components, a printed circuit plate 56 is being withdrawn from hopper 54 and brought to Station D to receive components from carriage 68. The preferred manner of doing this is shown in FIGS. 2, 6, and 14, which show a shaft 60, which is rotatable about its axis relative to a nonrotating jaw 64, two pairs of jaws 62 and 65, and a pusher 63 which serves to push the lowermost board 56 in the direction of arrow 67 in FIG. 2. Shaft 60 and jaw 64 are reciprocable, by linkage, longitudinally of the axis of the shaft to bring fingers 62 and corresponding portions of jaw 64 into alignment with Station C or with Station D. When fingers 62 are in alignment with Station D, fingers 65 will be in alignment with Station E. By this arrangement, as pusher 63 is moving board 56 until it protrudes beyond the vertical plane of hopper, shaft 60 is approaching from the right in FIG. 2. When fingers 62 and jaws 64 are in position relative to the edge of the circuit board, shaft 60 is rotated so as to clamp fingers 62 on the board. Shaft 60 now moves to the right in FIG. 2 to bring board 56 to Station D. Here, the shaft is counterrotated to release the board for engagement with the component-applying mechanism described below. After releasing board 56, shaft 60 again moves to the left in FIG. 2 to bring fingers 62 into engaging position with the edge of a second board 56 which has been moved into the path of the fingers by pusher 63. Shaft 60 is now again rotated to clamp fingers 62 on the edge of a board at Station C and to clamp fingers 65 on the edge of the board which was previously brought to Station D and which has received its complement of components 78. Movement of shaft 60, to the right in FIG. 2 takes the board grasped by fingers 65 from Station D to Station E, and brings the board grasped by fingers 62 from Station C to Station D. At Station E the completed board is released from the shaft for removal; the board at Station D is released from the shaft for application of components 78, and shaft 60 again moves to the left in FIG. 3 to bring a third, fresh board from Station C to Station D, and to move the completed, second board to disposal Station E, and so on. In other words, except at the beginning and at the end of the operation, shifter shaft 60 will shift two boards with each stroke: one from Station C to Station D, and the other from Station D to Station E.

Shaft 60 is reciprocated by any suitable means such as a motor, not shown, operatively connected to link L which is carried by a shaft. Shaft 60 is rotated about its axis to clamp, or unclamp, fingers 62 on the board 56 by a link 61 which is moved arcuately by means of a gear segment, or an eccentric, or other conventional means.

The mechanism for applying components 78 to circuit boards 56, is located at Station D, partly above and partly below the circuit board, FIGS. 3 to 9.

Figure 7:
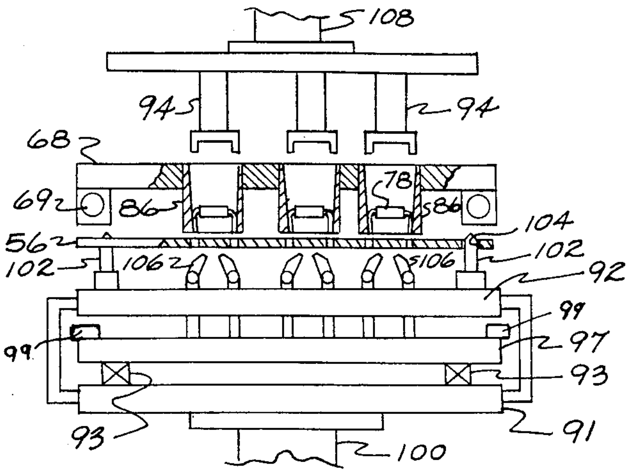
Figure 8:
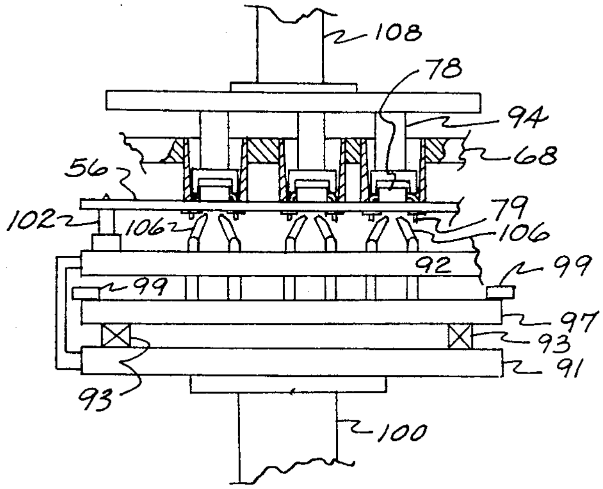
Figure 9:
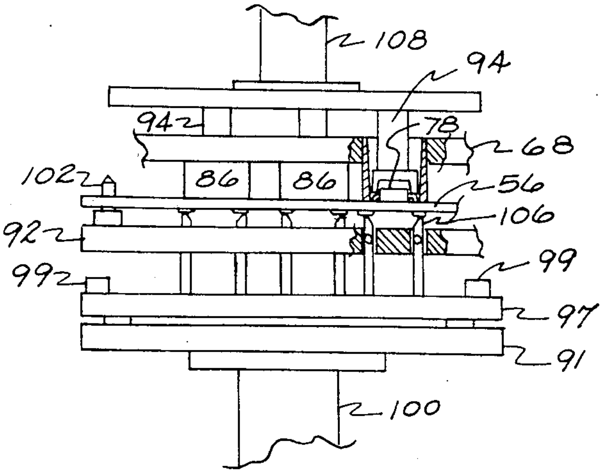

The part of the component-applying mechanism below the board 56 includes a platen 91 which is raised and lowered by cylinder 100 and which carries springs 93 which support anvil plate 97. Plate 97 carries stops 99 which will be further referred to. Above plate 97 is a guide plate 92 which is provided with holes for the passage of fingers 106 which are carried by anvil plate 97. Plate 92 carries prongs 102 which are adapted to enter corresponding holes in board 56 to insure proper positioning of the board. Fingers 106 are flexible and when not operating, are curved convergently as shown in FIGS. 6, 7 and 8.

The part of the component-applying mechanism above board 56 includes pushers 94 which are in vertical alignment with openings 86 in carriage 68 and which are vertically reciprocated by cylinder 108. Pushers 94 are adapted to enter openings 86 and to push components 78 down against the upper blank side 55 of the circuit board. As can be seen from FIG. 8, the end wires 79 of the components enter the corresponding holes 81 in the boards. As end wires 79 enter holes 81, cylinder 100 moves anvil plate 97 upwardly until stops 99 abut guide plate 92. Further upward movement of platen 91 compresses springs 93 and, through stops 99, moves guide plate 92 upwardly, FIG. 9. It will be noted that, before upward movement of guide plate 92, the upper ends of each pair of fingers 106 converge so as to lie between the end wires 79 which protrude downwardly through the board. (FIG. 8). As the anvil plate 97 rises, it causes fingers 106 to apply pressure against the board, and the concomitant rise of guide plate 92 progressively straightens the bent ends of the fingers. The resultant movement of the upper ends of fingers 106 is in opposite direction so as to bend end wires 79 in opposite horizontal directions, so that wires 79 now contact the adjacent portions of circuit portion 59 on the underside of the circuit board, to complete the selected circle.

What I claim is:

1. Apparatus of the type described including:
   - a first magazine storage station,
   - a second magazine storage station,
   - a first working station intermediate said first and second stations,
   - a first magazine assembly comprising at least one magazine,
   - a second magazine assembly comprising at least one magazine,
   - means for selectively moving said first or said second magazine into said first working station,
   - each magazine of each assembly being adapted to contain at least one electric circuit-completing component,
   - a second working station,
   - a third storage station located to one side of said second working station,
   - a hopper at said third storage station adapted to contain at least one circuit board having disconnected circuit fragments thereon,
   - a first carriage movable between said third storage station and said second working station and operable to bring a circuit board from said hopper to said second working station,
   - a second carriage movable between said first and second working stations and operable to bring a component from a magazine at said first working station and hold it in alignment with selected circuit fragments on said board,
   - means for removing the component from said second carriage, and
   - means for securing the component to the board in engagement with said selected fragments.

2. The apparatus defined in claim 1 wherein
   - said first carriage includes means for simultaneously grasping a first circuit board at said third storage station and a second circuit board at said second working station,
   - a fourth storage station to the other side of said second working station, and
   - means for releasing said first circuit board at said second working station and for releasing said second circuit board at said fourth storage station.

3. The apparatus defined in claim 1 wherein
   - said second carriage moves in a plane above the plane of movement of said first carriage, and
   - means at said second working station for moving said board upwardly towards said first carriage, and
   - means for moving said component downwardly into engagement with said board.

BEST AVAILABLE COPY

4. The apparatus defined in claim 1 wherein
said circuit fragments are non-uniformly oriented and wherein each of said magazine assemblies comprises a corresponding number of correspondingly oriented magazines, and
said second carriage comprises a corresponding number of correspondingly oriented component receiving elements, and
means for simultaneously withdrawing a number of components from corresponding magazines, and
wherein said means for securing the components to the board comprises a number of correspondingly oriented mechanisms, one for each magazine, and
means for actuating all of said mechanisms simultaneously.

5. Apparatus for securing circuit-completing components to circuit fragments carried by circuit boards to complete the circuits which include such fragments, said components having flexible end wires and said board having through holes therein for the passage of said wires into engagement with said circuit fragments, said apparatus including
a first storage station,
a second storage station,
a first working station between said storage stations,
a first platform movable between said first working station and said first storage station,
a second platform movable between said first working station and said second storage station,
a third storage station,
a hopper at said third storage station for containing at least one circuit board,
a fourth storage station,
a second working station between said third and fourth storage stations and aligning with said first working station,
a first carriage movable between said first and second working stations,
component receiving elements carried by said first carriage,
a second carriage movable between said third and fourth storage stations,
clamping means carried by said second carriage for bringing a board from said third storage station to said second working station and for bringing a board from said second working station to said fourth storage station,
means at said first working station for withdrawing components from magazines at said first working station and delivering them to the component receiving elements on said first carriage when the latter is at said first working station, means at said second working station for moving said components out of said receiving elements and into engagement with a board at said second working station with the wires of the component passing through the holes in the board, and
fastening means for securing said components to the board.

6. The apparatus defined in claim 5 wherein the fastening means includes fingers mounted for vertical movement below a board at said second working station, and
means for moving said fingers into engagement with the wires passing through the board to deflect said wires against the surface of said board.

7. Apparatus of the type described, including:
a first magazine storage station,
a first working station adjacent said storage station,
at least one magazine at said magazine storage station,
means for moving said magazine into and out of said first working station,
said magazine being adapted to contain at least one electric circuit-completing component,
a second working station,
a second storage station located to one side of said second working station and adapted to contain at least one circuit board having disconnected circuit fragments thereon,
a first carriage movable between said second storage station and said second working station and operable to bring a circuit board from said second storage station to said second working station,
a second carriage movable between said first and second working stations and operable to bring a component from a magazine at said first working station and hold it in alignment with selected circuit fragments on said board,
means for moving the component out of said second carriage, and
means for securing the component to the board in engagement with said fragments.

References Cited

UNITED STATES PATENTS

| | | | |
|---|---|---|---|
| 2,893,006 | 7/1959 | Stuhre | 29—626 |
| 3,134,167 | 5/1964 | Diekhoff | 29—203 |
| 3,200,481 | 8/1965 | Lenders | 29—203 |

THOMAS H. EAGER, Primary Examiner

U.S. Cl. X.R.

29—626